United States Patent [19]
Ebert et al.

[11] Patent Number: 6,159,758
[45] Date of Patent: Dec. 12, 2000

[54] METHOD OF IMPROVING LASER YIELD FOR TARGET WAVELENGTHS IN EPITAXIAL INGAASP LASERS BASED UPON THE THERMAL CONDUCTIVITY OF THE INP SUBSTRATE

[75] Inventors: Chris W. Ebert; Mary L. Gray, both of Wyomissing; Karen A. Grim-Bogdan, Greenwich Township; Joseph Brian Seiler, Penn Township, both of Berks County; Nikolaos Tzafaras, Sinking Spring, all of Pa.

[73] Assignee: Lucent Technologies Inc., Murray Hill, N.J.

[21] Appl. No.: 09/350,712

[22] Filed: Jul. 9, 1999

[51] Int. Cl.$^7$ ................................................. H01L 21/20
[52] U.S. Cl. .............................................. 438/22; 438/483
[58] Field of Search ................................. 438/22, 23, 35, 438/46, 483, 481, 478, 956, 796; 117/89; 427/248.1, 419.8, 255.34

[56] References Cited

U.S. PATENT DOCUMENTS 4,148,045  4/1979  Fang et al. .
6,033,926  3/2000  Chakrabarth et al. ..................... 438/35

*Primary Examiner*—Savitri Mulpuri

[57] ABSTRACT

A method of producing a batch of MQW lasers from a plurality of wafers having doping concentrations within a concentration range. The MQW lasers are produced by epitaxially growing an InGaAsP quaternary layer on the substrates in a metal-organic chemical vapor deposition (MOCVD) reactor. The method includes the steps of segregating the substrates into groups based upon the substrate doping concentrations and batch producing the lasers at specific target wavelengths for each segregated substrate group.

5 Claims, 3 Drawing Sheets

METHOD OF IMPROVING LASER YIELD FOR TARGET WAVELENGTHS IN EPITAXIAL INGAASP LASERS BASED UPON THE THERMAL CONDUCTIVITY OF THE INP SUBSTRATE

BACKGROUND OF THE INVENTION

1. Field of the Invention

The present invention pertains to a process for manufacturing multiple quantum-well (MQW) lasers for use in fiber optic communications systems. More particularly, the present invention relates to a process for controlling target lasing frequencies of MQW lasers.

2. Description of Related Art

MQW lasers are widely used in fiber optic communication systems to launch carrier wavelengths ($\lambda$) along an optic fiber. The carrier wavelengths are modulated by data signals and transmitted along fibers in the system. Typical "standard" carrier wavelengths at which components of fiber optic systems, such as receivers, couplers, routers, etc., are designed to operate are 1.3, 1.4 and 1.5 $\mu$m. Thus, lasers used in existing systems are specifically designed to produce a lasing wavelength at a particular one of these target wavelengths.

A common method of producing MQW lasers utilizes metal-organic chemical vapor deposition (MOCVD) reactors wherein lasers are epitaxially grown on sulfur-doped InP (S-InP) wafers or substrates. The S-INP substrates are typically bulk-produced to yield wafers having doping concentrations within a range of 3 to $6 \times 10^{18}/cm^3$. The bulk-produced substrates are then used to mass produce $In_{1-x}Ga_xAs_yP_{1-y}$ MQW lasers in batches by setting MOCVD reactor parameters, e.g., temperature, pressure, duration and concentration of deposition dopants, etc., in an attempt to yield batches of lasers which produce a desired target wavelength ($\lambda$), e.g. 1.3 $\mu$m lasers.

Prior to batch production, a test run is typically performed in each reactor by placing one or more substrates in a common reactor and adjusting the reactor parameters to yield the desired lasing wavelength (e.g. 1.3, 1.4 or 1.5 $\mu$m). Lasers within an acceptable range, e.g. ±7 nm of the target wavelength, are usable whereas lasers outside of this range are discarded. If a test run is successful, then a batch run is conducted and the resulting lasers are tested to determine whether they are in fact within the desired range of the target wavelength.

A problem with known laser batch production techniques is that the batch production yield is oftentimes unacceptable because numerous lasers from each batch generate lasing wavelengths outside of the acceptable range of a target wavelength. This results in the discarding of numerous lasers and, consequently, an increase in laser production costs.

SUMMARY OF THE INVENTION

The inventive method provides for the bulk manufacture of MQW lasers while improving control over resulting lasing wavelengths generated by the produced lasers. The lasers are produced on InP substrates using known epitaxial growth techniques such as those employing MOCVD reactors. The substrates used for laser production range in doping concentration which, it has been discovered, causes lasing frequency diversion from a desired target wavelength such that substrates having various doping concentrations and used in a common bulk production will produce lasers having differing lasing frequencies. By segregating or dividing the substrates into groups based on doping concentration ranges, and then using substrates within a common group to produce a bulk run of lasers, MQW lasers from the bulk run will be produced having substantially common lasing frequencies.

Other objects and features of the present invention will become apparent from the following detailed description considered in conjunction with the accompanying drawings. It should be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENT

Figure 1:
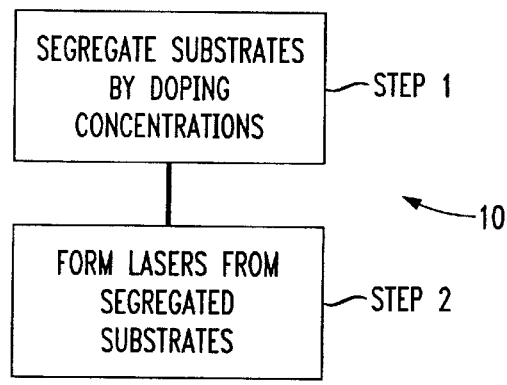
FIG. 1 depicts the preferred steps of a method in accordance with the present invention.

In multiple wafer metal-organic chemical vapor deposition (MOCVD) laser manufacturing processes for producing InGaAsP multiple quantum-well (MQW) lasers, a quaternary layer in which the MQWs are formed is realized using epitaxial growth techniques, as is known by those having ordinary skill in the art. The lasers are formed on bulk-produced stock wafers or substrates which are acted upon in MOCVD reactors such that all wafers in a common batch undergo identical reactor conditions, e.g. pressure, temperature, deposition time, dopant concentration, etc. The substrates are preferably n-type InP silicon wafers wherein the n-dopant is sulfur (S-InP).

The S-InP wafers used for manufacturing lasers are produced in bulk and range in carrier concentration from 3 to $6 \times 10^{18}/cm^3$. In prior art processes, the wafers used for a bulk run are randomly chosen and placed within a reactor to produce a batch of lasers at a desired target wavelength, such, for example as a 1.3, 1.4 or 1.5 $\mu$m wavelength. Thus, a group or batch of wafers are placed in a reactor and the reactor parameters are programmed to produce a batch of lasers which generates lasing wavelengths at a desired target wavelength.

When MQW laser batches are produced using stock wafers, the lasing wavelengths of a significant number of the resulting lasers fall outside of an acceptable deviation range with respect to an intended target wavelength. For example, if a batch of lasers having a target wavelength of 1.3 µm are to be produced and the MOCVD reactor parameters are adjusted or set to yield the target wavelength, numerous lasers in the batch will nevertheless yield lasing frequencies which are greater than or less than an acceptable range, e.g. ±7 nm of the intended 1.3 µm target wavelength. Such lasers are unusable for many applications and must generally be discarded.

Applicants have discovered that the concentration of charge carriers and, hence, the dopant concentration in the substrates upon which the quaternary layer is formed has a direct impact on the realization of a particular target wavelength and, in particular, on the lasing frequencies produced by the resulting lasers. This, it has been discovered, is primarily due to the variation in heat absorption and dissipation rates among substrates having differing doping concentrations. When heat is applied to a substrate, such as during a manufacturing process in an MOCVD reactor, a substrate having a high doping concentration has a greater number of charge carriers which absorb and dissipate heat more readily, thus resulting in a substrate having a lower surface temperature relative to the surface temperature of a substrate having a low doping concentration. During epitaxial growth of an InGaAsP layer on the substrate surface, the amount of phosphorous (P) absorbed by the substrate is dependent on the substrate surface temperature and the resulting lasing wavelength is dependent on the amount of absorbed phosphorous. Thus, the amount of phosphorous absorbed into the substrate surface is controlled or dictated by the substrate temperature which, in turn, is controlled by the substrate doping concentration.

Such a discovery is significant in the field of epitaxially grown MQW lasers wherein lasers must be formed within a narrow range of a target wavelength (e.g., ±7 nm) and wherein lasers having lasing wavelengths outside of the narrow range are discarded. The lasers are produced, as explained above, using known MOCVD processing techniques by epitaxially growing an InGaAsP quaternary layer on a batch of substrate wafers having doping concentrations ranging from, for example, 3 to $6 \times 10^{18}/cm^3$. It has been discovered that for every $1 \times 10^{18}/cm^3$ change in doping concentration, an approximate 3 nm variation from an intended target wavelength results (e.g., a target wavelength of 1.3, 1.4 or 1.5 µm). Thus, by forming a batch of lasers from a batch of substrates having a common doping concentration range, the resulting yield of lasers at a desired target wavelength will be increased. In other words, there will be fewer resulting MQW lasers to discard from each MOCVD reactor-produced laser batch.

In accordance with the present invention, applicants' discovery is utilized in a method 10 for producing a batch of lasers, as shown in FIG. 1, by first segregating the S-InP substrates into doping ranges (step 1). For example, for a particular lot of substrate wafers having sulfur doping concentrations ranging from 3 to $6 \times 10^{18}/cm^3$, the substrates are arranged, categorized or segregated into groups such as a first group having a substrate concentration of 3 to $4 \times 10^{18}/cm^3$, a second group having a substrate concentration of 4 to $5 \times 10^{18}/cm^3$ and a third group of 5 to $6 \times 10^{18}/cm^3$. Preferably, or at least by way of currently preferred example, the doping concentrations of the wafers are measured by Hall-effect processes, as known by those having ordinary skill in the art. Once the wafers are segregated into groups, batch production of MQW lasers is performed on each group to yield lasers having a desired target wavelength (step 2).

For example, epitaxial layers can be grown using trimethyl indium (TMIn) and triethyl gallium (TEGa) as group III sources, and $AsH_3$ and $PH_3$ as group V sources, with the layers grown at a reactor temperature of 650° C. A 1.3 µm wavelength laser structure, as is known in the art, may be formed from multiple alternating periods of InGaAsP wells and barrier layers ($\lambda$=1.05 µm), such as seven (7) periods, with well and barrier thicknesses of 70 Å and 100 Å, respectively. Separate confinement layers ($\lambda$=1.05 µm) may also be deposited above and below the MQWs. Above the MQWs and the upper separate confinement layer, an undoped InP setback layer followed by a zinc-doped InP clad layer and a sacrificial InGaAsP layer may be deposited. An n-separate confinement layer and an n-type InP spacer layer can be grown below the MQWs.

Figure 2:
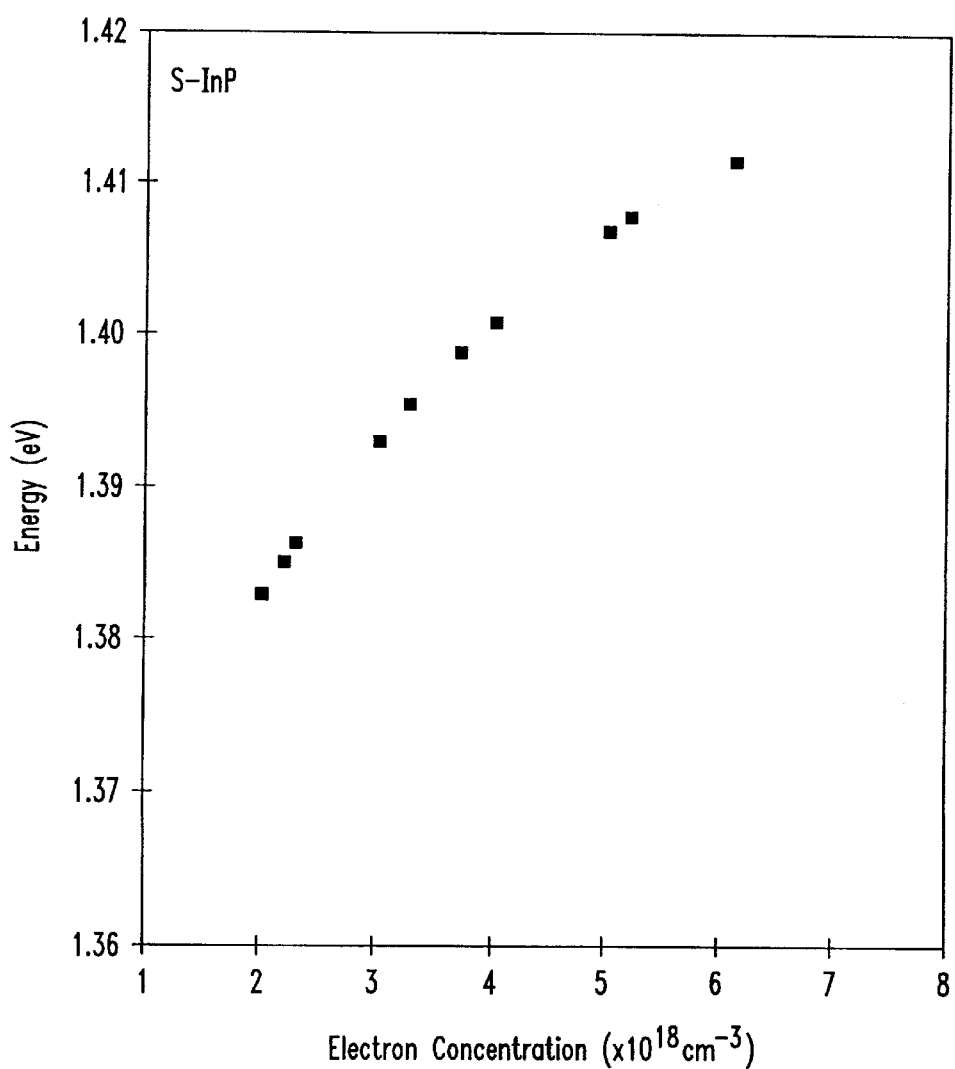
FIG. 2 is a graphical illustration of the Fermi energy with respect to the conduction band edge as a function of the substrate free carrier concentration of the substrates used in accordance with an experimental implementation of the present invention.
Figure 3:
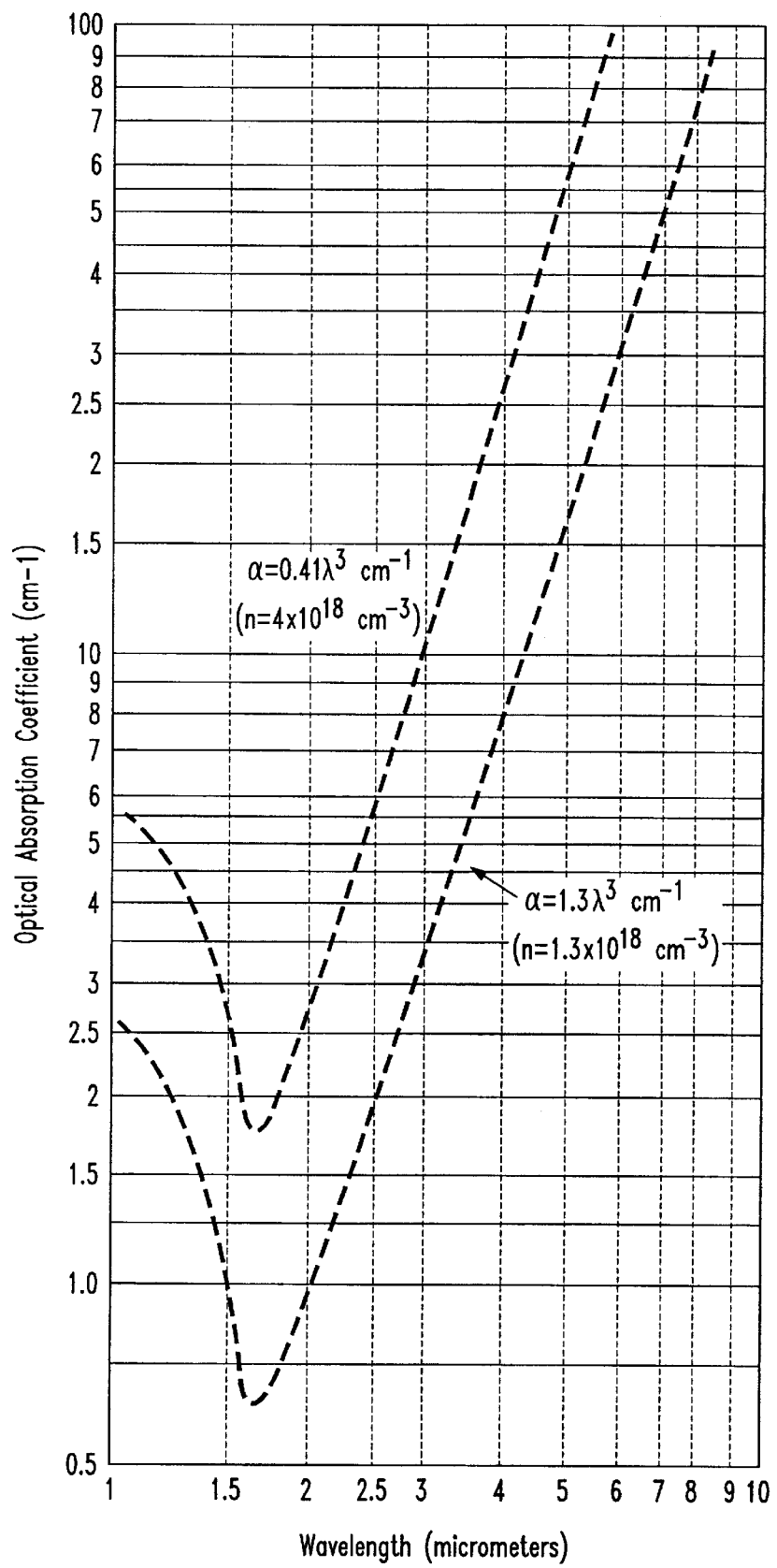
FIG. 3 displays the optical absorption coefficients for two S-InP substrate samples as a function of wavelength at room temperature by measuring the near-IR and mid-IR transmittances.

FIG. 2 displays the Fermi energy with respect to the conduction band edge as a function of the substrate free carrier concentration. As shown, the Fermi level shifts to a higher energy with increasing free carrier density. FIG. 3 displays the optical absorption coefficients for two S-InP substrate samples as a function of wavelength at room temperature by measuring the near-IR and mid-IR transmittances. The results presented in FIG. 3 demonstrate that the fundamental absorption edge shifts to a higher energy with increasing free carrier concentration and correlates with the data shown in FIG. 2.

Figure 4:
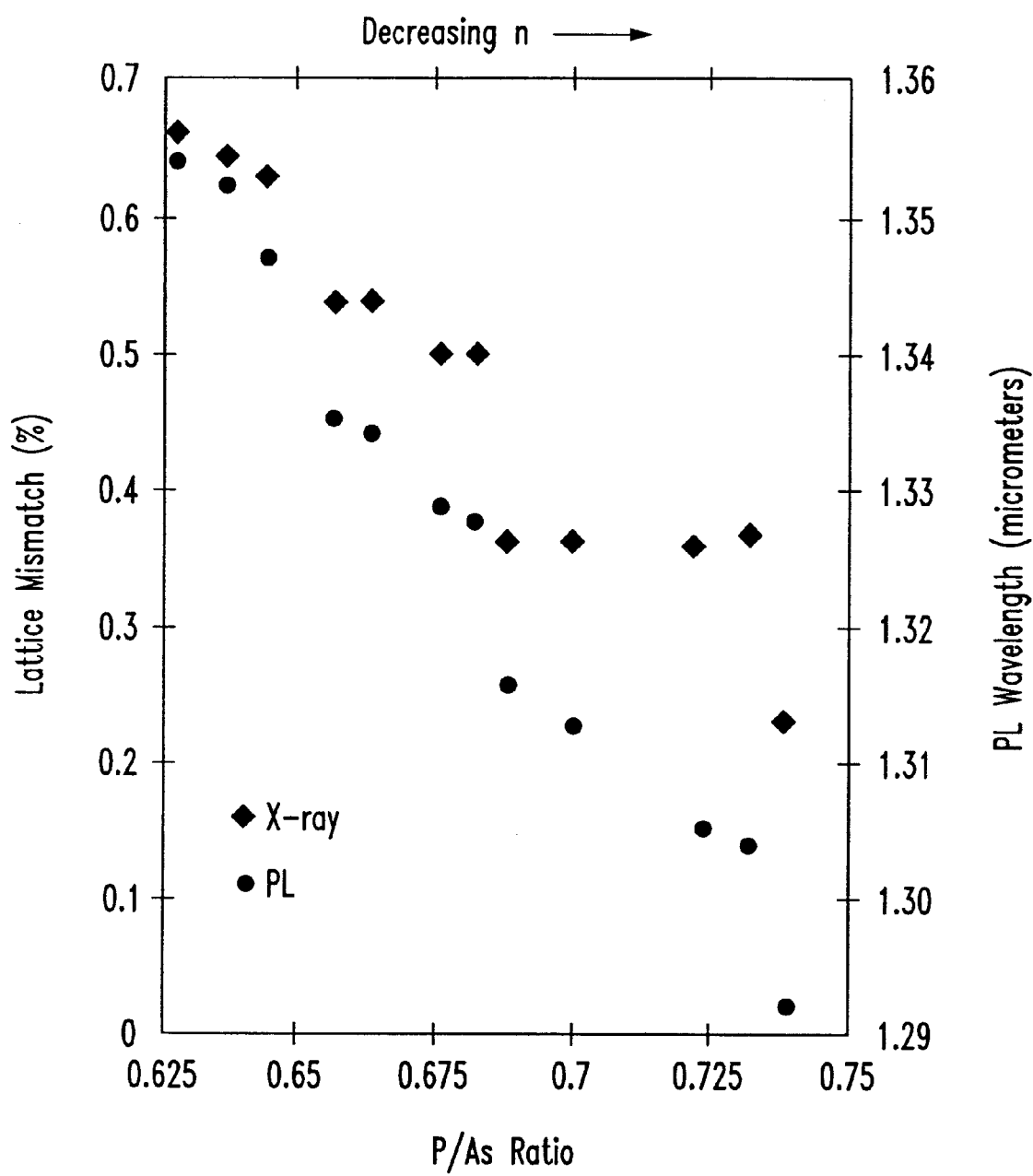
FIG. 4 depicts the average unrelaxed lattice mismatch obtained for the wells and barriers, and the average photoluminescence wavelength measured for the quantum wells, as functions of the phosphorous to arsenic ratio and the InP substrate carrier density.

For experimental analysis, four epitaxial growth runs were carried out on InP substrates with varying carrier concentrations for the 1.3 µm laser structure. The average unrelaxed lattice mismatch obtained for the wells and barriers, and the average photoluminescence wavelength measured for the quantum wells, are displayed in FIG. 4 as functions of the phosphorous to arsenic ratio and the InP substrate carrier density. FIG. 4 demonstrates that both the lattice mismatch and photoluminescence wavelength decrease as the InP substrate carrier concentration decreases.

It will be appreciated that any of the segregated substrate groups can be used to produce any desired target wavelength, such as 1.3, 1.4 or 1.5 µm wavelengths, by simply adjusting the parameters of the manufacturing processes in the MOCVD reactors. In other words, substrates in the first group defined above (i.e. carrier concentrations of 3 to $4 \times 10^{18}/cm^3$) may be used to produce a batch of either 1.3, 1.4 or 1.5 µm lasers by suitably adjusting the reactor parameters for that batch as is known in the art. Moreover, lasers having different lasing frequencies may be produced in a single batch by using substrates having various doping concentrations.

By dividing the bulk substrates into doping ranges, as explained above, the yield of the produced lasers for a given target wavelength is notably increased because the variants of lasing wavelengths among lasers within a particular batch will be reduced. In other words, for each batch more lasers will be produced having lasing wavelengths within the acceptable standard deviation range of a particular target wavelength.

Thus, while there have shown and described and pointed out fundamental novel features of the invention as applied to a preferred embodiment thereof, it will be understood that various omissions and substitutions and changes in the form and details of the methods described and devices illustrated, and in their operation, may be made by those skilled in the art without departing from the spirit of the invention. For example, it is expressly intended that all combinations of those method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A process for producing a batch of multiple quantum well InGaAsP lasers each having a lasing wavelength within a narrow acceptable wavelength range of a target wavelength, the lasers being formed on a quantity of substrates having carrier doping concentrations within a bulk doping concentration range, said process comprising:

segregating said quantity of substrates into substrate groups based on the carrier doping concentration of each of the substrates so that substrates having substantially similar carrier doping concentrations within a segregating range smaller than the bulk range are segregated into respective common groups; and epitaxially growing, from at least one of said segregated substrate groups, InGaAsP quaternary layers in a metal-organic chemical vapor deposition (MOCVD) reactor, on said substrates in said at least one group for producing a batch of lasers having lasing wavelengths within the narrow acceptable range of the target wavelength.

2. The process of claim 1, wherein said target wavelength is one of 1.3, 1.4 and 1.5 $\mu$m and wherein said narrow wavelength range is ±7 nm.

3. The process of claim 1, wherein said substrates are S-doped InP substrates.

4. The process of claim 1, wherein said segregating step comprises utilizing Hall effect processes to measure the doping concentration of each of the substrates.

5. The process of claim 1, wherein said segregating step comprises utilizing Hall effect processes to measure the doping concentration of each of the substrates.

* * * * *